US008354155B2

(12) United States Patent
Tauchi et al.

(10) Patent No.: US 8,354,155 B2
(45) Date of Patent: Jan. 15, 2013

(54) RECORDING LAYER FOR OPTICAL INFORMATION RECORDING MEDIUM, OPTICAL INFORMATION RECORDING MEDIUM, AND SPUTTERING TARGET

(75) Inventors: Yuuki Tauchi, Kobe (JP); Yoko Shida, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 84 days.

(21) Appl. No.: 13/127,994

(22) PCT Filed: Nov. 11, 2009

(86) PCT No.: PCT/JP2009/069222
§ 371 (c)(1),
(2), (4) Date: May 6, 2011

(87) PCT Pub. No.: WO2010/055865
PCT Pub. Date: May 20, 2010

(65) Prior Publication Data
US 2011/0216643 A1 Sep. 8, 2011

(30) Foreign Application Priority Data

Nov. 12, 2008 (JP) .................. 2008-290309
Sep. 18, 2009 (JP) .................. 2009-217291
Sep. 18, 2009 (JP) .................. 2009-217292

(51) Int. Cl.
*B32B 3/02* (2006.01)

(52) U.S. Cl. ................ 428/64.1; 428/64.4; 430/270.12; 430/270.13

(58) Field of Classification Search .................. 428/64.4; 430/270.12, 270.13
See application file for complete search history.

(56) References Cited

U.S. PATENT DOCUMENTS

| 6,033,752 | A | 3/2000 | Suzuki et al. |
| 2003/0228539 | A1 | 12/2003 | Hosoda et al. |
| 2005/0082162 | A1 | 4/2005 | Uno et al. |
| 2005/0233247 | A1 | 10/2005 | Hosoda et al. |
| 2007/0170434 | A1 | 7/2007 | Inoue et al. |
| 2010/0178446 | A1 | 7/2010 | Fujii et al. |
| 2010/0227107 | A1 | 9/2010 | Ido et al. |
| 2011/0044157 | A1 | 2/2011 | Miki et al. |

FOREIGN PATENT DOCUMENTS

| JP | 2002 225433 | 8/2002 |
| JP | 2003 326848 | 11/2003 |

(Continued)

OTHER PUBLICATIONS

Office Action issued Mar. 15, 2011, in Japanese Patent Application No. 2009-217291 (with English-language translation).

(Continued)

*Primary Examiner* — Elizabeth Mulvaney
(74) *Attorney, Agent, or Firm* — Oblon, Spivak, McClelland, Maier & Neustadt, L.L.P.

(57) ABSTRACT

A recording layer for an optical information recording medium, which has a high reflectance (initial reflectance) and excellent recording characteristics; an optical information recording medium comprising the recording layer; and a sputtering target useful for forming the recording layer. The recording layer for an optical information recording medium, on which recording is performed by irradiation of laser light, is characterized by containing indium (In) oxide and palladium (Pd) oxide which includes palladium monoxide and palladium dioxide. The recording layer for an optical information recording medium is also characterized in that the ratio of Pd atoms contained in the recording layer relative to the total of In atoms and Pd atoms contained therein is 6-60 atom %.

14 Claims, 2 Drawing Sheets

FOREIGN PATENT DOCUMENTS

| | | |
|---|---|---|
| JP | 2003 331461 | 11/2003 |
| JP | 3499724 | 12/2003 |
| JP | 2005 135568 | 5/2005 |
| JP | 2005-314734 | 11/2005 |
| JP | 2005 314734 | 11/2005 |
| JP | 2007 196683 | 8/2007 |
| JP | 2007 230207 | 9/2007 |
| JP | 4110194 | 4/2008 |
| JP | 2008 302688 | 12/2008 |
| JP | 2010-137546 | 6/2010 |
| JP | 2010-214809 | 9/2010 |
| JP | 2011-42070 | 3/2011 |
| WO | 03 101750 | 12/2003 |

OTHER PUBLICATIONS

International Search Report issued Dec. 22, 2009 in PCT/JP09/69222 filed Nov. 11, 2009.

RECORDING LAYER FOR OPTICAL INFORMATION RECORDING MEDIUM, OPTICAL INFORMATION RECORDING MEDIUM, AND SPUTTERING TARGET

TECHNICAL FIELD

The present invention relates to a recording layer for an optical information recording medium, an optical information recording medium, and a sputtering target useful for formation of the recording layer.

BACKGROUND ART

The optical information recording media (optical disks) are typified by optical disks such as CD, DVD, and BD, and are largely classified into three types of read-only type, write-once read-many type, and rewritable type according to the recording and reproduction system. Out of these, the recording system of the write-once read-many type optical disk is largely classified into, mainly, a phase change system in which the recording layer is allowed to undergo a phase change, an interlayer reaction system in which a plurality of recording layers are allowed to react, a system in which a compound forming the recording layer is decomposed, and a punching system in which recording marks such as holes or pits are locally formed in the recording layer.

With the phase change system, materials utilizing the changes in optical characteristics due to crystallization of the recording layer have been proposed as materials for the recording layer. For example, in Patent Literature 1, there is proposed a recording layer containing Te—O-M (where M is at least one element selected from metal elements, metalloid elements, and semiconductor elements). In Patent Literature 2, there is proposed a recording layer containing Sb and Te.

As the recording layer of an optical information recording medium of the interlayer reaction system, for example, in Patent Literature 3, there is proposed a recording layer in which a first recording layer includes an alloy containing In—O— (Ni, Mn, or Mo), and a second recording layer includes an alloy containing one element selected from Se and/or Te element, O (oxygen), and Ti, Pd, and Zr. Whereas, Patent Literature 4 proposes the following: a first recording layer: a metal containing In as a main component, and a second recording layer: a metal or a non-metal other than an oxide, containing at least one element belonging to the group VB or the group VIB are stacked; thus, recording is performed by the reaction or alloying due to heating.

As the recording layer of the system of decomposing the compound forming the recording layer, for example, in Patent Literature 5, a recording layer containing a nitride as a main component is shown. A study is conducted on materials for performing recording by decomposition of the nitride with heating, or an organic dye material.

As the recording layer of the punching system, the layer including a low-melting-point metal material has been studied. For example, in Patent Literature 6, there is proposed the layer including an alloy obtained by adding elements of the group IIIB, the group IVB, or the group VB to an Sn alloy. The present applicant also proposes, in Patent Literature 7, a recording layer including a Sn-based alloy containing Ni and/or Co in an amount within the range of 1 to 50 at %. Further, the present applicant proposes, in Patent Literature 8, a recording layer including an In alloy containing Co in an amount of 20 to 65 at %, or the In alloy further containing one or more elements selected from Sn, Bi, Ge, and Si in an amount of 19 at % or less.

[Citation List]
[Patent Literatures]
 [PTL 1] JP-A No. 2005-135568
 [PTL 2] JP-A No. 2003-331461
 [PTL 3] JP-A No. 2003-326848
 [PTL 4] Japanese Patent No. 3499724
 [PTL 5] WO2003/101750
 [PTL 6] JP-A No. 2002-225433
 [PTL 7] JP-A No. 2007-196683
 [PTL 8] Japanese Patent No. 4110194

SUMMARY OF INVENTION

Technical Problem

As the performance requirements demanded of an optical information recording medium, there are mainly demands: for the optical information recording medium to have a reflectivity enough for reproduction and to be capable of being recorded with a practical recording laser power (to have a high recording sensitivity); and for a recording signal to have a signal amplitude enough for reproduction (to have a high degree of modulation) and to have a high signal intensity (to have a high C/N ratio).

However, with the recording materials disclosed as the related-art technologies, all the performance requirements are difficult to satisfy with each recording material alone. With the phase change system, the reflectivity with the recording layer alone is low, which requires a reflective film for enhancing the reflectivity in an optical disk state. In addition, in order to increase the degree of modulation, dielectric layers such as $ZnS$—$SiO_2$ are required to be provided on and under the recording layer. This results in an increase in number of layers forming the optical disk. Whereas, also with the interlayer reaction system, a plurality of recording layers are necessary, resulting in an increase in number of layers forming the optical disk. Accordingly, the number of film layers increases, unfavorably resulting in reduction of the productivity. In contrast, with the punching system, the reflectivity of the recording layer itself is high, and a large degree of modulation can be ensured. Accordingly, the number of layers forming the optical disk can be reduced. However, it has been found that a further study is necessary for achieving a higher recording sensitivity. Still further, the durability of the recording layer (particularly, the durability against high temperatures and high humidities) is also necessary.

The present invention was made in view of such circumstances. It is an object of the present invention to provide a recording layer for an optical information recording medium capable of satisfying the performance requirements while reducing the number of layers of an optical disk, and enhancing the productivity of the optical information recording medium, an optical information recording medium including the recording layer, and a sputtering target useful for formation of the recording layer.

Solution to Problem

The gist of the present invention will be shown below.
(1) A recording layer for an optical information recording medium on which recording is performed by irradiation with a laser light, the recording layer including an In oxide and a Pd oxide, the Pd oxide including a Pd monoxide and a Pd dioxide, and the ratio of the amount of Pd atoms to the total amount of In atoms and Pd atoms contained in the recording layer being 6 to 60 at %.
(2) The recording layer for an optical information recording medium according to the item (1), wherein the ratio of the amount of the Pd dioxide to the total amount of the Pd monoxide and the Pd dioxide is 5 to 70 mol %.
(3) The recording layer for an optical information recording medium according to the item (1) or (2), wherein the film thickness is 5 to 100 nm.
(4) The recording layer for an optical information recording medium according to any of the items (1) to (3), wherein recording is performed by formation of bubbles in portions irradiated with a laser light.

(5) An optical information recording medium including the recording layer for an optical information recording medium according to any of the items (1) to (4).

(6) An optical information recording medium, including: a recording layer on which recording is performed by irradiation with a laser light; and a dielectric layer formed adjacent to the recording layer, the recording layer including an In oxide and a Pd oxide, the Pd oxide including a Pd monoxide and a Pd dioxide, and the ratio of the amount of Pd atoms to the total amount of In atoms and Pd atoms contained in the recording layer being 6 to 60 at. %

(7) The optical information recording medium according to the item (6), wherein the ratio of the amount of the Pd dioxide to the total amount of the Pd monoxide and the Pd dioxide contained in the recording layer is 5 to 70 mol %.

(8) The optical information recording medium according to the item (6) or (7), wherein the dielectric layer includes an oxide, a nitride, a sulfide, a carbide, or a mixture thereof.

(9) The optical information recording medium according to the item (8), wherein the oxide contained in the dielectric layer is an oxide of one or more elements selected from the group consisting of In, Zn, Sn, Al, Si, Ge, Ti, Ta, Nb, Hf, Zr, Cr, Bi, and Mg; the nitride therein is at least one nitride of Si and Ge; the sulfide therein is a Zn sulfide; and the carbide therein is a carbide of one or more elements selected from the group consisting of Si, Ti, and W.

(10) The optical information recording medium according to any of the items (6) to (9), wherein the film thickness of the dielectric layer is 2 to 40 nm.

(11) The optical information recording medium according to any of the items (6) to (10), wherein the film thickness of the recording layer is 5 to 100 nm.

(12) The optical information recording medium according to any of the items (6) to (11), wherein recording is performed by formation of bubbles in portions irradiated with a laser light in the recording layer.

(13) A sputtering target for forming the recording layer for an optical information recording medium according to any of the items (1) to (4), the sputtering target including an In oxide and Pd (preferably including an In oxide as a main component, and Pd), and the ratio of the amount of Pd atoms to the total amount of In atoms and Pd atoms contained in the sputtering target being 6 to 60 at %(preferably 6 to 50 at %).

(14) A sputtering target for forming the recording layer for an optical information recording medium according to any of the items (1) to (4), the sputtering target substantially including an In-based alloy containing Pd in a ratio of the amount of Pd atoms to the total amount of In atoms and Pd atoms of 6 to 60 at % (preferably 6 to 50 at %).

Incidentally, the recording layer for an optical information recording medium of the item (4) is preferably the recording layer for an optical information recording medium according to any of the items (1) to (3) on which recording is performed by formation of bubbles in the portions irradiated with a laser light, and changes in volume thereof.

The optical information recording medium of the item (8) is preferably the optical information recording medium according to the item (6) or (7), wherein the dielectric layer includes an oxide, a nitride, a sulfide, a carbide, or a mixture thereof.

The optical information recording medium of the item (9) is preferably the optical information recording medium of the item (8), wherein the oxide forming the dielectric layer is an oxide of one or more elements selected from the group consisting of In, Zn, Sn, Al, Si, Ge, Ti, Ta, Nb, Hf, Zr, Cr, Bi, and Mg; the nitride forming the dielectric layer is at least one nitride of Si and Ge; the sulfide forming the dielectric layer is a Zn sulfide; and the carbide forming the dielectric layer is a carbide of one or more elements selected from the group consisting of Si, Ti, and W.

The optical information recording medium of the item (12) is preferably the optical information recording medium according to any of the items (6) to (11), wherein recording is performed by formation of bubbles in portions irradiated with a laser light in the recording layer, and changes in volume thereof.

The sputtering target of the item (14) is a sputtering target for forming the recording layer for an optical information recoding medium according to any of the items (1) to (4). The sputtering target is preferably a sputtering target including an In-based alloy including Pd in a ratio of the amount of Pd atoms to the total amount of In atoms and Pd atoms of 6 to 60 at % (preferably 6 to 50 at %).

Advantageous Effects of Invention

In accordance with the present invention, it is possible to provide a recording layer for a write-once read-many type optical information recording medium having a high reflectivity (initial reflectivity), and an excellent recording sensitivity with a practical recording laser power, and a write-once read-many type optical information recording medium having the recording layer, and being excellent in durability of the recording layer. Further, in accordance with the present invention, it is possible to provide a sputtering target useful for formation of the recording layer.

Incidentally, in this description, the wording "having an excellent recording sensitivity" means, as described in details in the column of Examples later, being capable of achieving a high C/N ratio (carrier to noise ratio, the ratio in output level of the signal for reading and the noise of background) and a high degree of modulation with a relatively low recording power.

DESCRIPTION OF EMBODIMENTS

Figure 1:
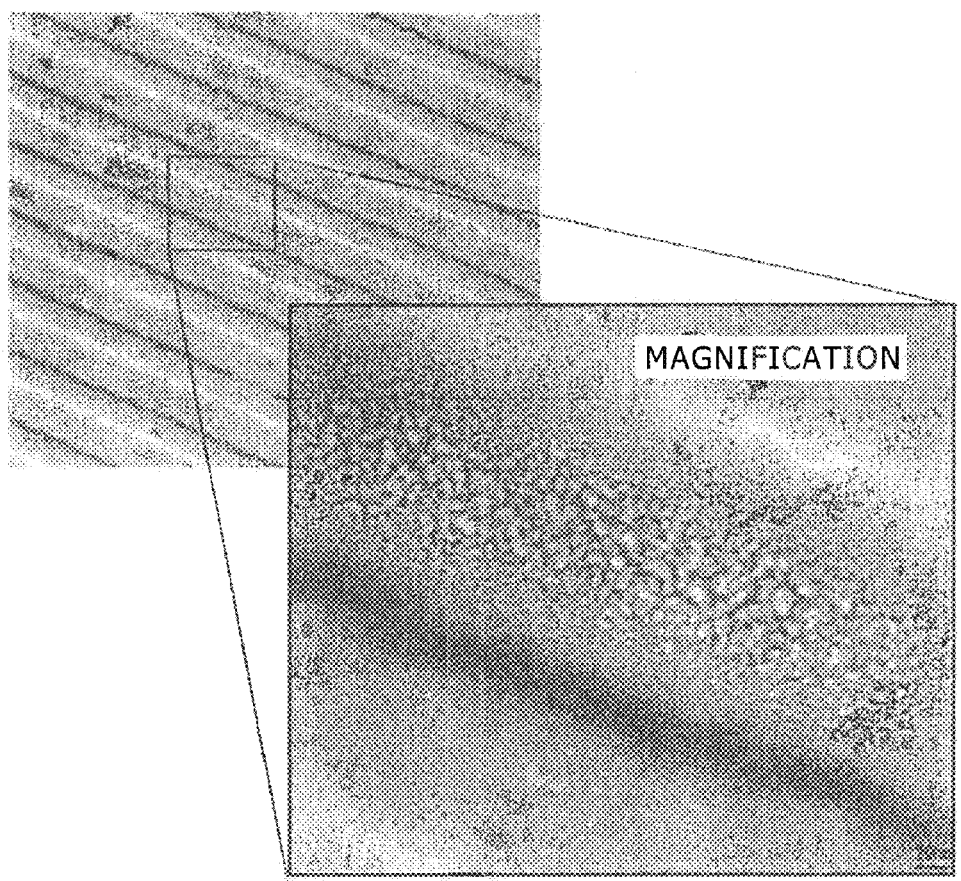
FIG. 1 is a TEM observation photograph of the surface of a recording layer for an optical information recording medium in accordance with the present invention.

The present inventors conducted a close study to implement a recording layer for a write-once read-many type optical information recording medium having a higher reflectivity, and a more excellent recording sensitivity with a practical recording laser power, than those of a conventional recording layer, and an optical information recording medium including the recording layer, and being excellent in durability of the recording layer. As a result, the present inventors found the following. As different from a conventional recording layer, there is implemented a recording layer which contains an In oxide and a Pd oxide, where the Pd oxide includes a Pd monoxide and a Pd dioxide. Thus, when the recording layer is irradiated with a laser, the Pd oxide is heated by laser irradiation, and is decomposed to release oxygen, which changes the structure of the recording layer. Specifically, bubbles are formed in the portions irradiated with a laser, thereby to perform reversible recording. With this system, it is possible to remarkably enhance the recording sensitivity than in the related art. Further, when a dielectric layer is formed adjacent to the recording layer, it is possible to remarkably enhance the durability of the recording layer.

With the recording system by the recording layer, the structure of the recording layer before laser irradiation is amorphous, and is also still amorphous even after laser irradiation. In this respect, the recording system by the recording layer is different from the phase change system utilizing the phenomenon in which the amorphous phase is changed into the crystalline phase by laser irradiation.

The reason why the recording layer of the present invention is excellent in recording sensitivity can be considered as follows. At the portions in which bubbles have been formed by laser irradiation, the transmittance increases (i.e., the reflectivity decreases) as compared with the portions in which bubbles have not been formed, which can increase the degree of modulation.

Further, inclusion of a Pd oxide as described above can increase the refractive index as compared with the case of no inclusion of Pd oxide. Accordingly, a high reflectivity can be obtained. Further, the light absorptivity of the film can be increased. Accordingly, the energy of the laser for signal recording can be converted into heat with efficiency. As a result, the Pd oxide decomposition is promoted with a practical recording laser power, which can sufficiently improve the recording sensitivity.

In order for the effects to be sufficiently exerted, it is necessary to set the ratio of the amount of Pd atoms to the total amount of In atoms and Pd atom contained in the recording layer (which may be hereinafter referred to as a "Pd content") at 6 at % or more. When the Pd content is less than 6 at %, the amount of Pd oxide to be decomposed upon laser irradiation is small. Accordingly, the amount of oxygen released is not sufficient, resulting in reduction of resulting bubbles. As a result, the signal intensity (C/N ratio) decreases. Further, the light absorptivity of the recording layer also decreases, undesirably resulting in an increase in laser power necessary for recording. The Pd content is preferably 8 at % or more, and more preferably 10 at or more.

On the other hand, when the Pd content exceeds 60 at %, the degree of modulation decreases. For this reason, in the present invention, the upper limit of the Pd content is set at 60 at %. The upper limit of the Pd content is preferably 50 at %, and more preferably 45 at %.

When the Pd oxide includes, particularly, a Pd monoxide and a Pd dioxide, the recording sensitivity can be more sufficiently improved. The reason for this can be considered as follows: Pd dioxide which is more unstable than Pd monoxide is decomposed to release oxygen with ease by laser irradiation; and in the presence of Pd dioxide in Pd monoxide which is more stable than Pd dioxide, spontaneous decomposition of the Pd dioxide is inhibited, resulting in a stable recording layer.

In order to enhance the amount of oxygen released due to decomposition of the Pd dioxide, and to sufficiently improve the recording sensitivity, it is preferable to set the ratio of the amount of the Pd dioxide to the total amount of the Pd monoxide and the Pd dioxide at 5 mol % or more. On the other hand, when Pd dioxide is excessively larger in amount than Pd monoxide, the Pd dioxide cannot be present stably. This may make manufacturing of the recording layer difficult. For this reason, the ratio of the amount of the Pd dioxide to the total amount of the Pd monoxide and the Pd dioxide is preferably set at 70 mol % or less. The ratio is more preferably 60 mol % or less.

The recording layer of the present invention contains, the Pd oxide, and in addition, an oxide of "In" which has a larger absolute value of the standard formation free energy of an oxide per mol of oxygen than that of Pd. Thus, inclusion of In oxide more stable than Pd oxide with Pd oxide can clarify and increase the change in form due to release of oxygen upon decomposition of the Pd oxide, which can sufficiently improve the recording sensitivity.

The recording layer of the present invention contains an In oxide as described above, and preferably contains an In oxide in an amount of 50 mol % or more. Incidentally, the recording layer of the present invention contains the In oxide and a Pd oxide, and in addition, may contain inevitable impurities. Further, for the purpose of improving the absorptivity and controlling the refractive index, the recording layer may contain Sn, Al, Bi, Cu, Nb, Ti, Si, and Ta in an oxide or metal state in a total amount within the range of about 30 at % or less.

The film thickness of the recording layer depends upon the structure of the optical information recording medium such as a structure in which other layers such as metal compound layers or metal layers are inserted on and under the recording layer. However, in either case where the recording layer is used as a monolayer (the case where a dielectric layer or an optical adjustment layer is not provided), or otherwise, the film thickness of the recording layer is preferably set at 5 to 100 nm. When the film thickness of the recording layer is smaller than 5 nm, a sufficient change in reflectivity due to recording is less likely to be obtained. More preferably, the film thickness is 10 nm or more, further preferably 20 nm or more, and particularly preferably 25 nm or more. On the other hand, when the film thickness of the recording layer is larger than 100 nm, formation of the film takes time. As a result, the productivity is reduced, and the laser power necessary for recording tends to increase. The film thickness is more preferably 70 nm or less, and further preferably 60 nm or less.

The recording layer of the present invention contains, as described above, a Pd oxide (e.g., PdO, PdO2, or PdOX). However, in order to obtain a recording layer in such a form, the recording layer is preferably formed with a sputtering method. The sputtering method is preferable because it can ensure the film thickness distribution uniformity in disk plane.

In order to form the recording layer containing the Pd oxide by a sputtering method, as the sputtering conditions, the ratio of the oxygen flow rate to the Ar (argon) flow rate is preferably set at 0.5 to 10.0. Other conditions in the sputtering method have no particular restriction. Widely used methods can be adopted. It is essential only that the gas pressure is controlled, for example, within the range of 0.1 to 1.0 Pa, and that the sputtering electric power is controlled, for example, within the range of 0.5 to 20 W/cm$^2$.

For the sputtering target for use in the sputtering method (which may be hereinafter simply referred to as a "target"), mention may be made of use of:

(A) a sputtering target characterized by including an In oxide (specifically, for example, containing an In oxide in an amount of 50 mol % or more), and Pd (e.g., a Pd oxide and/or metal Pd), and characterized in that the ratio of the amount of Pd atoms to the total amount of In atoms and Pd atoms contained in the sputtering target is 6 to 60 at %; or (B) a sputtering target characterized by including an In-based alloy containing Pd (e.g., metal Pd) in a ratio of the amount of Pd atoms to the total amount of In atoms and Pd atoms of 6 to 60 at %. Alternatively, mention may be made of the following:

(C) a metal In target (pure In metal target) and a metal Pd target (pure Pd metal target) are used, and these are simultaneously discharged for performing multi-target sputtering.

Incidentally, for the sputtering target of the item (A), particularly, the one obtained by mixing powders of In oxide and metal Pd, and sintering the mixture is used. This is preferable in terms of the productivity, the in-plane uniformity of the composition of the formed thin film, and control of the thickness thereof.

For manufacturing of the sputtering target, inevitable impurities may be mixed, though in a trace amount, as impurities in the sputtering target. However, the component composition of the sputtering target of the present invention does not specify even the trace components to be inevitably mixed therein. Unless the characteristics of the present invention are inhibited, mixing of a trace amount of the inevitable impurities is acceptable.

The optical information recording medium of the present invention is characterized by including the recording layer. Other configurations than that of the recording layer have no particular restriction. Known configurations in the field of the optical information recording medium can be adopted. Alternatively, the optical information recording medium can include the recording layer, and also can include the following dielectric layer formed adjacent to the recording layer.

The optical information recording medium of the present invention has the recording layer having the excellent characteristics. However, the optical information recording medium is also required to keep the excellent characteristics, namely, to ensure excellent durability even under high-temperature high-humidity environment. Under the environment, the Pd oxide in each portion on which laser irradiation is not performed (i.e., recording is not performed) is gradually reduced to release oxygen. As a result, the optical characteristics changes, which appears as reduction of the reflectivity. This can be considered as the cause of reduction of the durability. However, it can be considered as follows: the dielectric layer is formed adjacent to the recording layer, which can inhibit unnecessary decomposition of, and can stably hold the Pd oxide (particularly, Pd dioxide) in the recording layer.

As the form of the wording "the dielectric layer is formed adjacent to the recording layer", for example, mention may be made of the case where it is formed between a substrate and the recording layer, and adjacent to the recording layer; and/or the case where it is formed between the recording layer and an optical transmission layer described later, and adjacent to the recording layer.

The dielectric layer also improves the durability by acting as an oxygen barrier layer. By preventing escaping of oxygen which may be formed by unnecessary decomposition of the Pd oxide, it is possible to prevent the changes in reflectivity (particularly, reduction of the reflectivity). Thus, it is possible to ensure the necessary reflectivity as the recording layer.

By further forming a dielectric layer, it is also possible to improve the recording characteristics. This can be considered as follows: the thermal diffusion of the laser incident through the dielectric layer is optimally controlled, thereby to prevent excessive increase in size of bubbles in the recording portions, and breakage of bubbles due to excessive progress of decomposition of Pd oxide; as a result, the form of each bubble can be optimized.

As the materials for the dielectric layer, mention may be made of oxides, nitrides, sulfides, carbides, and fluorides, or mixtures thereof. As the oxides, mention may be made of oxides of one or more elements selected from the group consisting of In, Zn, Sn, Al, Si, Ge, Ti, Ta, Nb, Hf, Zr, Cr, Bi, and Mg. As the nitrides, mention may be made of nitrides of one or more elements selected from the group consisting of In, Sn, Ge, Cr, Si, Al, Nb, Mo, Ti, and Zn (preferably, nitrides of Si and/or Ge). As the sulfides, Zn sulfide may be mentioned. As the carbides, mention may be made of carbides of one or more elements selected from the group consisting of In, Sn, Ge, Cr, Si, Al, Ti, Zr, Ta, and W (preferably, carbides of one or more elements selected from the group consisting of Si, Ti, and W). As the fluorides, mention may be made of fluorides of one or more elements selected from the group consisting of Si, Al, Mg, Ca, and La. As mixtures thereof, mention may be made of $ZnS-SiO_2$, and the like. Out of these, preferred are the compounds (oxides and the like) containing any one or more of In, Zn, Sn, Al, Si, Ti, and Mg, or mixtures thereof. Further preferred are the compounds containing any one or more elements of In, Zn, Sn, and Al, or mixtures thereof.

The film thickness of the dielectric layer is preferably set at 2 to 40 nm. This is due to the following: when the film thickness is less than 2 nm, the effects of the dielectric layer (particularly, the effect as an oxygen barrier) are (is) less likely to be sufficiently exerted. The film thickness is more preferably 3 nm or more. On the other hand, when the film thickness of the dielectric layer is too large, a change (formation of bubbles) in the recording layer due to laser irradiation becomes less likely to occur. This may cause reduction of the recording characteristics. Accordingly, the film thickness of the dielectric layer is preferably set at 40 nm or less, and more preferably 35 nm or less.

The present invention does not specify even the formation method of the dielectric layer. However, the dielectric layer is preferably formed by a sputtering method as with the recording layer.

For forming the dielectric layer by a sputtering method, as the sputtering conditions, mention may be made of the following: the Ar flow rate is set, for example, within the range of 10 to 100 sccm; when a metal target is used as described below, the oxygen flow rate for oxide layer formation is set, for example, within the range of 5 to 60 sccm; and the nitrogen flow rate for nitride layer formation is set, for example, within the range of 5 to 80 sccm. Further, mention may be made of the following: the gas pressure is set, for example, within the range of 0.1 to 1.0 Pa; and the sputtering electric power is set, for example, within the range of 0.5 to 50 $W/cm^2$.

As the sputtering targets for use in formation of the dielectric layer, there can be used, other than the targets including the compounds (oxides, nitrides, sulfides, carbides, and fluorides), metal target containing other constituent elements than oxygen, nitrogen, sulfur, carbon, and fluorine in the compound (targets including pure metals and alloys).

For the optical information recording medium of the present invention, other configurations than those of the recording layer and the dielectric layer have no particular restriction. Known configurations in the field of the optical information recording medium can be adopted.

As the optical information recording medium (optical disk), mention may be made of the one of a structure in which on a substrate including grooves for guiding laser cut therein, a recording layer is stacked, and further thereon, an optical transmission layer is stacked.

For example, as the materials for the substrate, mention may be made of polycarbonate resins, norbornene type resins, cyclic olefin type copolymers, amorphous polyolefins, and the like. Whereas, for the optical transmission layer, polycarbonate or an ultraviolet ray-curable resin can be used. The materials for the optical transmission layer preferably has a high transmittance to the laser for performing recording and reproduction, and a small optical absorptivity. As the thickness of the substrate, for example, mention may be made of 0.5 mm to 1.2 mm. Whereas, as the thickness of the optical transmission layer, for example, mention may be made of 0.1 mm to 1.2 mm.

The recording layer of the present invention shows a high reflectivity, and shows excellent recording characteristics with the recording layer alone. However, if required, in order to improve the durability of the recording layer, on and/or under the recording layer, an oxide layer, a sulfide layer, a metal layer, or the like may be provided. By stacking these layers, it is possible to inhibit oxidation or decomposition which is deterioration with time of the recording layer. Further, in order to more enhance the reflectivity as the optical disk, an optical adjustment layer or a dielectric layer may be provided between the substrate and the recording layer. As the materials for the optical adjustment layer, there can be exemplified Ag, Au, Cu, Al, Ni, Cr, Ti, and the like, or alloys thereof.

Incidentally, in the above description, there was shown the monolayer optical disk including one recording layer and one optical transmission layer respectively formed therein. However, this is not exclusive. The optical disk may be a two- or more-layered optical disk in which a plurality of recording layers and optical transmission layers are stacked.

In the case of the two- or more-layered optical disk, between the recording layer group including the recording layer, and the optical adjustment layer and the dielectric layer stacked, if required, and another recording layer group, there may be a transparent intermediate layer including a transparent resin such as an ultraviolet ray-curable resin or polycarbonate, or the like.

The feature of the present invention resides in adopting the recording layer. In this case, there is no particular restriction on the formation methods of the substrate and the optical transmission layer other than the recording layer, and further, the optical adjustment layer, the dielectric layer, the transparent intermediate layer, and the like. The layers may be formed by commonly employed methods to manufacture the optical information recording medium.

Further, the feature of the present invention also resides in adopting the recording layer, and forming the dielectric layer adjacent to the recording layer. In this case, there is no particular restriction on the formation methods of the substrate and the optical transmission layer other than the recording layer and the dielectric layer, and further, the optical adjustment layer, the transparent intermediate layer, and the like. The layers may be formed by commonly employed methods to manufacture the optical information recording medium.

As the optical information recording medium, mention may be made of CD, DVD, or BD. For example, mention may be made of a BD-R capable of performing recording and reproduction of data by irradiating the recording layer with a blue laser light with a wavelength of about 380 nm to 450 nm, and preferably 405 nm as a specific example.

EXAMPLES

Below, the present invention will be described more specifically by way of examples. However, the present invention is not limited to the following examples. The present invention can also be practiced by being appropriately changed within the scope not departing from the gist described above and below. All of these are included in the technical range of the present invention.

Experimental Example 1

(1) Manufacturing of Optical Disk

Using a polycarbonate substrate (thickness: 1.1 mm, diameter: 120 mm, track pitch: 0.32 μm, and groove depth: 25 nm) as a disk substrate, on the substrate, each recording layer of various Pd contents was formed as shown in Table 1, by a DC magnetron sputtering method. The film thickness of the recording layer was set at 40 nm. Sputtering was performed by simultaneously discharging a pure In metal target and a pure Pd metal target.

The sputtering conditions for recording layer formation were set as follows: the Ar flow rate: 10 sccm, the oxygen flow rate: 10 sccm, the gas pressure: 0.4 Pa, the DC sputtering power: 100 to 200 W, and the substrate temperature: room temperature. The component composition (Pd content) of each deposited recording layer was measured by an ICP spectrometry, an X-ray fluorescence analysis method, or an X-ray photoelectron spectroscopy.

Incidentally, for No. 5 of Table 1 shown below, the ratio of metal Pd and Pd oxide (Pd atomic ratio) of Pd contained in the recording layer was determined. Specifically, using an X-ray photoelectron spectrometer Quantera SXM manufactured by Physical Electoronics Co., the depth direction analysis was performed. Thus, the ratio of metal Pd and Pd oxide was determined from the area intensity ratio of respective peaks of metal Pd and Pd oxide in the film central part. As a result, the ratio of metal Pd and Pd oxide in No. 5 was found to be 69:31.

In each deposited recording layer, In was present in an oxide form.

Then, on each recording layer obtained in the foregoing manner, an ultraviolet ray-curable resin ("BRD-864" manufactured by NIPPON KAYAKU Co., Ltd.) was spin coated, followed by ultraviolet ray irradiation. Thus, an optical transmission layer with a film thickness of about 0.1 mm was deposited, resulting in an optical disk.

(2) Evaluation of Optical Disk

The (initial) reflectivity and the recording characteristics of each manufactured optical disk were evaluated as described below.

By means of an optical disk evaluation device ("ODU-1000" manufactured by Pulstec Industrial Co., Ltd., recording laser wavelength: 405 nm, NA (numerical aperture): 0.85), a laser was applied onto a track. Thus, the reflectivity at a wavelength: 405 nm was determined by conversion from the return intensity of reflected light.

Using the optical disk evaluation device, with a recording laser power (recording power) within the range of 2 mW to 20 mW, a recording mark with a length: 0.60 μm (corresponding to 8T signal of Blu-ray Disc) was repeatedly formed at a linear velocity of 4.92 m/s.

Then, using a spectrum analyzer ("R3131R" manufactured by Advantest Co.), the ratios (C/N ratios, unit dB) of the signal intensity: carrier C (unit dB) of 4.12-MHz frequency component upon signal reading at a reproduction laser power of 0.3 mW, and the signal intensities: noise N (unit dB) of preceding and succeeding frequency components thereof were measured. Then, the highest C/N ratio and the recording laser power upon obtaining the highest C/N ratio were determined.

Whereas, by determining the reflectivity of the unrecorded portion, and the reflectivity of the recorded portion, the degree of modulation was calculated from the following equation (1):

$$\text{Degree of modulation(change ratio of reflectivity)} = \frac{(\text{Reflectivity of unrecorded portion} - \text{Reflectivity of recorded portion})}{(\text{Reflectivity of unrecorded portion})} \quad (1)$$

The results are shown together in Table 1. Incidentally, a sample with a reflectivity of 4% or more, a recording power (recording laser power upon obtaining the highest C/N ratio) of 9 mW or less, a C/N ratio (the highest C/N ratio) of 45 dB or more, and a degree of modulation of 0.40 or more was evaluated as having a high reflectivity (initial reflectivity), and an excellent recording sensitivity with a practical recording laser power.

TABLE 1

| No. | Pd content[X1] [at %] | Reflectivity [%] | Recording power [mW] | C/N [dB] | Degree of modulation (ratio) |
|-----|------------------------|------------------|----------------------|----------|------------------------------|
| 1   | 0                      | Unmeasurable     | Unmeasurable         | Unmeasurable | Unmeasurable              |
| 2   | 5.4                    | 5.7              | 20[X2]               | 48.2     | 0.31                         |
| 3   | 8.5                    | 11.2             | 9                    | 57.4     | 0.47                         |
| 4   | 16.1                   | 12.1             | 7.5                  | 59.5     | 0.62                         |
| 5   | 30.3                   | 14.9             | 5                    | 59.1     | 0.57                         |
| 6   | 44.9                   | 15.1             | 4                    | 57.7     | 0.48                         |
| 7   | 40.3                   | 15.3             | 4                    | 57.8     | 0.51                         |
| 8   | 44.7                   | 15.7             | 3.75                 | 55.8     | 0.42                         |
| 9   | 65                     | 15.7             | 3.5                  | 50.3     | 0.19                         |

[X1] Ratio of the amount of Pd atoms to the total amount of In atoms and Pd atoms contained in the recording layer
[X2] 20 mW is the limit of measurement From Table 1, it can be considered as follows. Namely, the recording layer satisfying the requirements of the present invention is found to have a high reflectivity, and an excellent recording sensitivity even with a low recording laser power.

In contrast, it is found as follows: when the Pd content is less than the lower limit specified in the present invention, the degree of modulation is small and the recording sensitivity is low; further, the reflectivity itself of the recording layer is low, which requires a higher recording power.

Further, it is found as follows: also when the Pd content exceeds the upper limit specified in the present invention, the degree of modulation has been remarkably reduced, and the recording sensitivity is low.

Experimental Example 2

Each optical disk was manufactured and evaluated in the same manner as in Experimental Example 1, except that each recording layer of the component compositions shown in Table 2 below was deposited using pure Cu or pure Ag in place of pure Pd. The results are shown in Table 2.

TABLE 2

| Component composition of recording layer | Reflectivity [%] | Recording power [mW] | C/N [dB] | Degree of modulation (ratio) |
|---|---|---|---|---|
| In—30.3 at % Pd | 14.9 | 5 | 59.1 | 0.57 |
| In—12.8 at % Cu | 8.9 | 12 | 48.9 | 0.2 |
| In—54.0 at % Ag | 1.7 | 4 | 30.8 | 0.4 |

From Table 2, when only Ag or Cu was contained in place of Pd, there occurred a deficiency such as small reflectivity, small C/N ratio, or a sufficient degree of modulation being unobtainable.

Experimental Example 3

An optical disk of No. 2 of Table 3 was manufactured and evaluated in the same manner as in Experimental Example 1, except that the deposition gas flow rate for deposition was changed as shown in Table 3 below. The results are shown in Table 3. Incidentally, No. 1 of Table 3 is the same as No. 5 of Table 1.

TABLE 3

| No. | Component composition of recording layer | Deposition gas flow rate (sccm) | | Reflectivity [%] | Recording power [mW] | C/N [dB] | Degree of modulation (ratio) |
|---|---|---|---|---|---|---|---|
| | | Ar | O$_2$ | | | | |
| 1 | In-30.3 at % Pd | 10 | 10 | 14.9 | 5 | 59.1 | 0.57 |
| 2 | In-35.3 at % Pd | 20 | 2 | 12.3 | 5 | 38.1 | 0.32 |

Table 3 indicates the following: as comparing the sample (No. 2) in which the oxygen content in the recording layer is small, and In and Pd are not sufficiently oxidized with No. 1 in which the oxygen content in the recording layer is larger than that of No. 2, when recording is performed with the same recording power, recording is possible in either case; but for No. 2, there has occurred a deficiency that a sufficient C/N ratio or degree of modulation cannot be obtained.

Incidentally, for the sample having good recording characteristics satisfying the requirements of the present invention, a TEM observation photograph of the recording layer surface after laser irradiation was taken. The TEM observation photograph is shown in FIG. 1. From FIG. 1 (particularly, the enlarged photograph), it is considered as follows: for the sample satisfying the requirements of the present invention, as described above, Pd oxide in the recording layer decomposes to generate oxygen, resulting in formation of bubbles; as a result, the recording sensitivity is sufficiently enhanced.

Experimental Example 4

(1) Manufacturing of Optical Disk

Using a polycarbonate substrate (thickness: 1.1 mm, diameter: 120 mm, track pitch: 0.32 μm, and groove depth: 25 nm) as a disk substrate, on the substrate, each recording layer of various contents of In oxide and metal Pd, and Pd oxide (respective molar ratios of Pd monoxide and Pd dioxide occupying the total amount of Pd monoxide and Pd dioxide are as shown in Table 4) was formed by a DC magnetron sputtering method. The film thickness of the recording layer was set at 40 nm. Sputtering was performed by multi-target sputtering by simultaneous discharging of two targets of a pure In metal target and a pure Pd metal target. The sputtering conditions for recording layer formation were set as follows: the Ar flow rate: constant at 10 sccm, the flow rate of oxygen to be introduced simultaneously with the Ar was changed within the range of 5 to 50 sccm as shown in Table 4; further, the gas pressure: 0.4 Pa, the DC sputtering power: 100 to 200 W, and the substrate temperature: room temperature.

The component composition (Pd content) of each deposited recording layer was measured by an ICP spectrometry, an X-ray fluorescence analysis method, or an X-ray photoelectron spectroscopy.

Then, on each resulting recording layer, an ultraviolet ray-curable resin ("BRD-864" manufactured by NIPPON KAYAKU Co., Ltd.) was spin coated, followed by ultraviolet ray irradiation. Thus, an optical transmission layer with a film thickness of about 0.1 mm was deposited, resulting in an optical disk.

Figure 2:
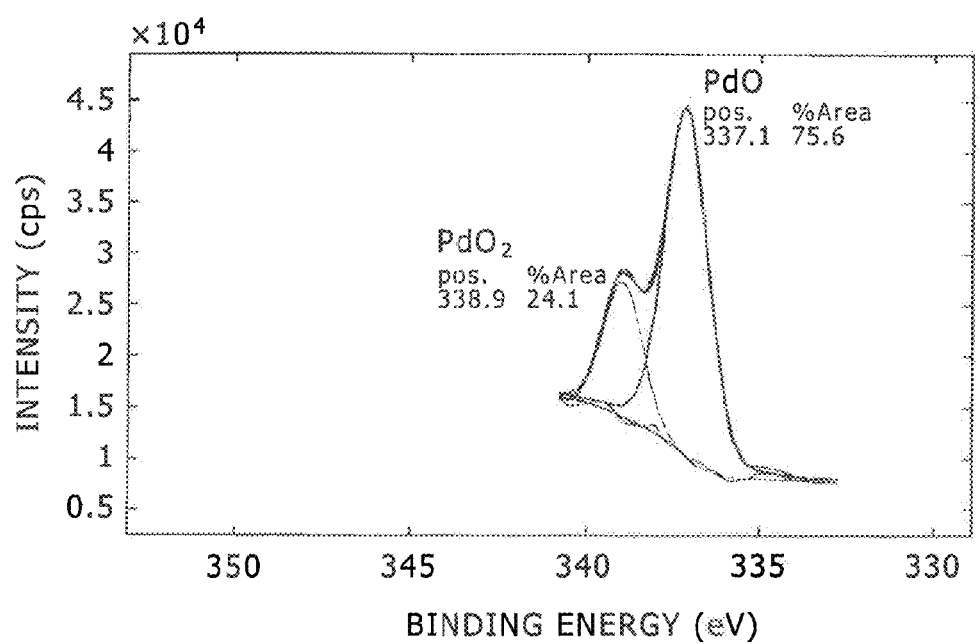
FIG. 2 is a Pd state analysis result (Pd 3d5/2 photoelectron spectrum) in Example.

The analysis of state of Pd was performed in the following manner. Namely, with an X-ray photoelectron spectrometer (the device was the Quantera SXM manufactured by Physical Electronics Co.), the outermost surface spectrum of the recording layer was measured. Thus, peak separation of Pd 3d5/2 photoelectron spectrum was performed. From the peak area ratio, the existence form of Pd present in the recording layer:the molar ratio (mol %) of metal Pd, Pd monoxide, and Pd dioxide was determined. The charge correction was performed with reference to photoelectrons from the C1s level. The analysis was performed in the following state: the optical transmission layer (cover layer) of the optical disk was peeled, so that the recording layer was formed on the polycarbonate substrate. The analysis region had a diameter of about 200 μm. As one example of the spectrum, the Pd 3d5/2 photoelectron spectrum of No. 4 in Table 4 is shown in FIG. 2.

(2) Evaluation of Optical Disk

Each manufactured optical disk was evaluated as described below. Namely, an optical disk evaluation device ("ODU-1000" manufactured by Pulstec Industrial Co., Ltd.) was used, and the recording laser central wavelength was set at 405 nm, and a lens with a NA (numerical aperture): 0.85 was used. The reflectivity shown below was determined from the return light intensity of reflected light from the unrecorded portion in the optical disk upon applying a laser on a track using the device.

Using the optical disk evaluation device, under the conditions of a linear velocity: 4.92 m/s, and a reference clock: 66 MHz, 2T to 8T random signals were recorded with various recording laser powers (recording powers). Then, there was determined the recording laser power (recording power) for minimizing the jitter value (value showing time-base fluctuations of a reproduced signal upon recording and reproduction with a reproduction laser power of 0.3 mW) measured using a time interval analyzer TA810 manufactured by Yokogawa Electric Corporation (each value is as shown in Table 4).

Thus, the degree of modulation (rate of change in reflectivity) with the recording power for minimizing the jitter value was determined from the following equation (1). Then, a sample with the degree of modulation of 0.40 or more was evaluated as acceptable.

Degree of modulation(rate of change in reflectivity)= (Reflectivity of unrecorded portion−Reflectivity of recorded portion)/(Reflectivity of unrecorded portion)  (1)

(upper) of each component/film thickness shown in Table 5 was formed as with the dielectric layer (lower).

Then, on the recording layer for No. 1, and on the dielectric layer (upper) for Nos. 2 to 12, an ultraviolet ray-curable resin ("BRD-864" manufactured by NIPPON KAYAKU Co., Ltd.) was spin coated, followed by ultraviolet ray irradiation. Thus, an optical transmission layer with a film thickness of about 0.1 mm was deposited, resulting in an optical disk.

TABLE 4

| No. | Deposition gas flow rate (sccm) Ar | Deposition gas flow rate (sccm) $O_2$ | Pd content[X1] [at %] | Pd ratio in each state [mol %] Metal Pd | Pd ratio in each state [mol %] Pd monoxide | Pd ratio in each state [mol %] Pd dioxide | Mol % of Pd dioxide[X2] | Recording power [mW] | Degree of modulation (ratio) |
|---|---|---|---|---|---|---|---|---|---|
| 1 | 10 | 10 | 48.8 | 0 | 76.0 | 24.1 | 24.1 | 4.1 | 0.54 |
| 2 | 10 | 15 | 52.8 | 0 | 72.2 | 27.8 | 27.8 | 3.4 | 0.48 |
| 3 | 10 | 20 | 48.6 | 0 | 65.4 | 34.6 | 34.6 | 3.2 | 0.41 |
| 4 | 10 | 30 | 29.1 | 0 | 45.7 | 54.3 | 54.3 | 4.7 | 0.47 |
| 5 | 10 | 50 | 28.9 | 0 | 48 | 52 | 52.0 | 5.1 | 0.41 |
| 6 | 10 | 5 | 16 | 79.8 | 20.2 | 0 | 0.0 | Unrecordable | Unmeasurable |

[X1]Ratio of the amount of Pd atoms to the total amount of In atoms and Pd atoms contained in the recording layer
[X2]100 × mol % of Pd dioxide/(mol % of Pd monoxide + mol % of Pd dioxide)

Table 4 indicates as follows. The presence of Pd dioxide as Pd oxide results in a high degree of modulation. Particularly, by setting the ratio of the amount of Pd dioxide to the total amount of Pd monoxide and Pd dioxide within the recommended range, it is possible to obtain a higher degree of modulation. Incidentally, for No. 6, the recording power and the degree of modulation were both unmeasurable. However, recording was performed with difficulty. As a result, the recording power was found to be 5.5 mW; and the degree of modulation, 0.15.

Example 5

(1) Manufacturing of Optical Disk

As a disk substrate, a polycarbonate substrate (thickness: 1.1 mm, diameter: 120 mm, track pitch: 0.32 μm, and groove depth: 25 nm) was used. Then, for Nos. 3 to 5, and 9 to 12 of Table 5 below, a dielectric layer (lower) with each component/film thickness shown in Table 5 was formed using an oxide target or a pure metal target with a DC magnetron sputtering method. The sputtering conditions for forming the dielectric layer (lower) were set as follows: the Ar flow rate: 10 to 30 sccm, the oxygen flow rate (when a pure metal target was used as a target): 0 to 10 sccm; the gas pressure: 0.2 to 0.4 Pa, the DC sputtering power: 100 to 400 W, and the substrate temperature: room temperature.

Then, each recording layer was formed. Specifically, on the substrates [for Nos. 3 to 5 and 9 to 12 of Table 5, on the dielectric layers (lower)], recording layers with a ratio of In atoms and Pd atoms of 60:40 were respectively formed with a DC magnetron sputtering method. The film thickness of the recording layer was set at 40 nm. As sputtering, there was performed multi-target sputtering by simultaneously discharging of two targets of a pure In metal target and a pure Pd metal target. The sputtering conditions for recording layer formation were set as follows: the Ar flow rate: 10 sccm, the oxygen flow rate: 10 sccm, the gas pressure: 0.4 Pa, the DC sputtering power: 100 to 200 W, and the substrate temperature: room temperature.

Then, for Nos. 2 to 12 of Table 5, using an oxide target or a pure metal target (e.g., as a target, $ZnS-SiO_2$, metal Mg, metal Zn, metal Sn, metal Bi, or metal Ti), a dielectric layer The following was separately confirmed. The recording layer contains an In oxide and a Pd oxide. The Pd oxide includes a Pd monoxide and a Pd dioxide. The ratio of the amount of the Pd dioxide to the total amount of the Pd monoxide and the Pd dioxide is 27.8 mol %. Incidentally, the analysis of state of Pd was performed in the following manner. Namely, with an X-ray photoelectron spectrometer (the device was the Quantera SXM manufactured by Physical Electronics Co.), the outermost surface spectrum of the recording layer was measured. Thus, peak separation of Pd 3d5/2 photoelectron spectrum was performed. From the peak area ratio, the existence form of Pd present in the recording layer:the molar ratio (mol %) of metal Pd, Pd monoxide, and Pd dioxide was determined. The charge correction was performed with reference to photoelectrons from the C1s level. The analysis region was set to have a diameter of about 200 μm.

(2) Evaluation of Optical Disk

Each manufactured optical disk was evaluated on the durability as described below.

With an optical disk evaluation device ("ODU-1000" manufactured by Pulstec Industrial Co., Ltd., recording laser wavelength: 405 nm, NA (numerical aperture): 0.85), the reflectivity (initial reflectivity) with a wavelength: 405 nm was determined by conversion from the return light intensity of reflected light from the unrecorded portion in the optical disk upon applying a laser on a track.

Further, there was performed an accelerated environmental test (constant-temperature constant-humidity test) for holding a sample in an air atmosphere with a temperature of 80° C. and a relative humidity of 85% for 96 hours. Thus, the reflectivity after the test was measured in the same manner as described above. then, the rate of change in reflectivity was determined from the following equation (2). The results are shown together in Table 5.

Rate of change in reflectivity(%)=100×(Reflectivity after test [%]−Initial reflectivity [%])/Initial reflectivity [%]  (2)

TABLE 5

| No. | Dielectric layer (lower) Component | Film thickness [nm] | Dielectric layer (upper) Component | Film thickness [nm] | Initial reflectivity [%] | Reflectivity after test [%] | Rate of change in reflectivity [%]✕ |
|---|---|---|---|---|---|---|---|
| 1 | — | — | — | — | 15.4 | 6.9 | −55.2 |
| 2 | — | — | In oxide ($In_2O_3$) | 10 | 14.4 | 10.0 | −30.5 |
| 3 | In oxide ($In_2O_3$) | 5 | In oxide ($In_2O_3$) | 5 | 14.9 | 13.9 | −6.7 |
| 4 | In oxide ($In_2O_3$) | 5 | Si oxide ($SiO_2$) | 10 | 16.5 | 14.6 | −11.9 |
| 5 | In oxide ($In_2O_3$) | 5 | Zn sulfide-Si oxide mixture ($ZnS$—$SiO_2$) | 20 | 9.4 | 10.0 | 6.8 |
| 6 | — | — | Si oxide ($SiO_2$) | 5 | 12.1 | 9.6 | −20.6 |
| 7 | — | — | Zn sulfide-Si oxide mixture ($ZnS$—$SiO_2$) | 10 | 11.2 | 8.0 | −28.8 |
| 8 | — | — | Mg oxide (MgO) | 10 | 13.7 | 9.9 | −27.5 |
| 9 | Zn oxide (ZnO) | 10 | Zn oxide (ZnO) | 10 | 12.4 | 10.4 | −16.2 |
| 10 | Sn oxide ($SnO_2$) | 10 | Sn oxide ($SnO_2$) | 10 | 12.9 | 12.2 | −5.3 |
| 11 | Bi oxide ($Bi_2O_3$) | 10 | Bi oxide ($Bi_2O_3$) | 10 | 8.1 | 9.5 | 17.7 |
| 12 | Ti oxide ($TiO_2$) | 10 | Ti oxide ($TiO_2$) | 10 | 11.2 | 9.1 | −18.4 |

✕ 100 × (Reflectivity after test [%] − Initial reflectivity [%])/Initial reflectivity [%]

Table 5 indicates the following: by forming the dielectric layer adjacent to the recording layer, it is possible to sufficiently reduce the change in reflectivity than in the case where the dielectric layer is not formed; accordingly, it is possible to implement an optical information recording medium excellent in durability. Particularly, it is indicated as follows: by forming the dielectric layers on and under the recording layer, the rate of change in reflectivity is remarkably reduced, resulting in excellent durability.

The present application was described in details, and by reference to specific embodiments. However, it is apparent to those skilled in the art that various changes and modifications may be made without departing from the spirit and scope of the present invention.

The present application is based on Japanese Patent Application No. 2008-290309 filed on Nov. 12, 2008, Japanese Patent Application No. 2009-217291 filed on Sep. 18, 2009, and Japanese Patent Application No. 2009-217292 filed on Sep. 18, 2009, the contents of which are incorporated herein by reference.

INDUSTRIAL APPLICABILITY

In accordance with the present invention, it is possible to provide a recording layer for a write-once read-many type optical information recording medium having a high reflectivity (initial reflectivity), and an excellent recording sensitivity with a practical recording laser power, and a write-once read-many type optical information recording medium having the recording layer, and being excellent in durability of the recording layer. Further, in accordance with the present invention, it is possible to provide a sputtering target useful for formation of the recording layer.

The invention claimed is:

1. A recording layer,
    comprising an In oxide and at least one Pd oxide the Pd oxide being at least a Pd monoxide and a Pd dioxide and the ratio of the amount of Pd atoms to the total amount of In atoms and Pd atoms in the recording layer being 6 to 60 at %.

2. The recording layer according to claim 1, wherein the ratio of the amount of the Pd dioxide to the total amount of the Pd monoxide and the Pd dioxide is 5 to 70 mol %.

3. The recording layer according to claim 1, wherein the film thickness is 5 to 100 nm.

4. The recording layer according to claim 1, wherein recording is performed by formation of bubbles in portions irradiated with a laser light.

5. An optical information recording medium comprising the recording layer according to claim 1.

6. An optical information recording medium, comprising:
    a recording layer on which recording is performed by irradiation with a laser light; and a dielectric layer formed adjacent to the recording layer,
    the recording layer comprising an In oxide and at least one Pd oxide, the Pd oxide being at least a Pd monoxide and a Pd dioxide, and the ratio of the amount of Pd atoms to the total amount of In atoms and Pd atoms in the recording layer being 6 to 60 at %.

7. The optical information recording medium according to claim 6, wherein the ratio of the amount of the Pd dioxide to the total amount of the Pd monoxide and the Pd dioxide contained in the recording layer is 5 to 70 mol %.

8. The optical information recording medium according to claim 6, wherein the dielectric layer comprises an oxide, a nitride, a sulfide, a carbide, or a mixture thereof.

9. The optical information recording medium according to claim 8, wherein the oxide in the dielectric layer is an oxide of one or more elements selected from the group consisting of In, Zn, Sn, Al, Si, Ge, Ti, Ta, Nb, Hf, Zr, Cr, Bi, and Mg; the nitride in the dielectric layer is at least one nitride of Si and Ge; the sulfide in the dielectric layer is a Zn sulfide; and the carbide in the dielectric layer is a carbide of one or more elements selected from the group consisting of Si, Ti, and W.

10. The optical information recording medium according to claim 6, wherein the film thickness of the dielectric layer is 2 to 40 nm.

11. The optical information recording medium according to claim 6, wherein the film thickness of the recording layer is 5 to 100 nm.

12. The optical information recording medium according to claim 6, wherein recording is performed by formation of bubbles in portions irradiated with a laser light in the recording layer.

13. A sputtering target for forming the recording layer for an optical information recording medium according to claim 1, the sputtering target comprising an In oxide and Pd, and the ratio of the amount of Pd atoms to the total amount of In atoms and Pd atoms in the sputtering target being 6 to 60 at %.

14. A sputtering target for forming the recording layer for an optical information recording medium according to claim 1, the sputtering target substantially comprising an In-based alloy comprising Pd in a ratio of the amount of Pd atoms to the total amount of In atoms and Pd atoms of 6 to 60 at %.

* * * * *